United States Patent [19]
Majos et al.

[11] Patent Number: 5,319,361
[45] Date of Patent: Jun. 7, 1994

[54] CIRCUIT MANAGING NUMBERS OF ACCESSES TO LOGIC RESOURCES

[75] Inventors: Jacques Majos, Le Versoud; Alain Andre, Crolles; Henri Teyssier, St-Ismier, all of France

[73] Assignee: France Telecom, Paris, France

[21] Appl. No.: 858,578

[22] Filed: Mar. 27, 1992

[30] Foreign Application Priority Data

Mar. 29, 1991 [FR] France .................................. 91 03815

[51] Int. Cl.$^5$ .......................................... H03K 17/296
[52] U.S. Cl. ............................ 340/825.79; 340/825.89; 340/825.83
[58] Field of Search ............... 340/825.03, 826, 825.79, 340/825.83, 825.85, 825.89; 370/65.5, 58.1, 58.2, 58.3

[56] References Cited

U.S. PATENT DOCUMENTS

| | | | |
|---|---|---|---|
| 4,331,956 | 5/1982 | Anderson | 340/825.89 |
| 4,821,258 | 4/1989 | Fraser | 340/825.89 |
| 4,884,264 | 11/1989 | Servel et al. | |
| 4,973,956 | 11/1990 | Lin et al. | 304/825.79 |
| 5,043,724 | 8/1991 | Trumpp et al. | 340/825.89 |

FOREIGN PATENT DOCUMENTS 298793  1/1989  European Pat. Off. .

*Primary Examiner*—Wellington Chin
*Attorney, Agent, or Firm*—Laubscher & Laubscher

[57] ABSTRACT

A circuit managing numbers of accesses to logic resources, such as buffer memory data cells in a time switching system. The circuit is structured around a counting cell matrix including a synchronous counter storing an instantaneous number of accesses relating to a corresponding data cell of the buffer memory. This encoded access number is representative of the number of outgoing multiplex ways from the system to which a data block received on an incoming multiplex way in the system must still be diffused. A given circuit operating cycle includes the loading of a counter by an access number corresponding to a free data cell address supplied by matrix column and row encoders during a cycle preceding the given cycle. This loading is obtained by selecting a column and row by cell-to-be-charged column and row decoders, and by applying the encoded access number to an input bus of the counters in the cells. Simultaneous to loading, an updated encoded number of a counter in a second matrix cell is decremented by one unity in response to the read-out address applied to cell-to-be-decremented address column and row decoders when the buffer memory cell corresponding to the second cell is being read.

11 Claims, 2 Drawing Sheets

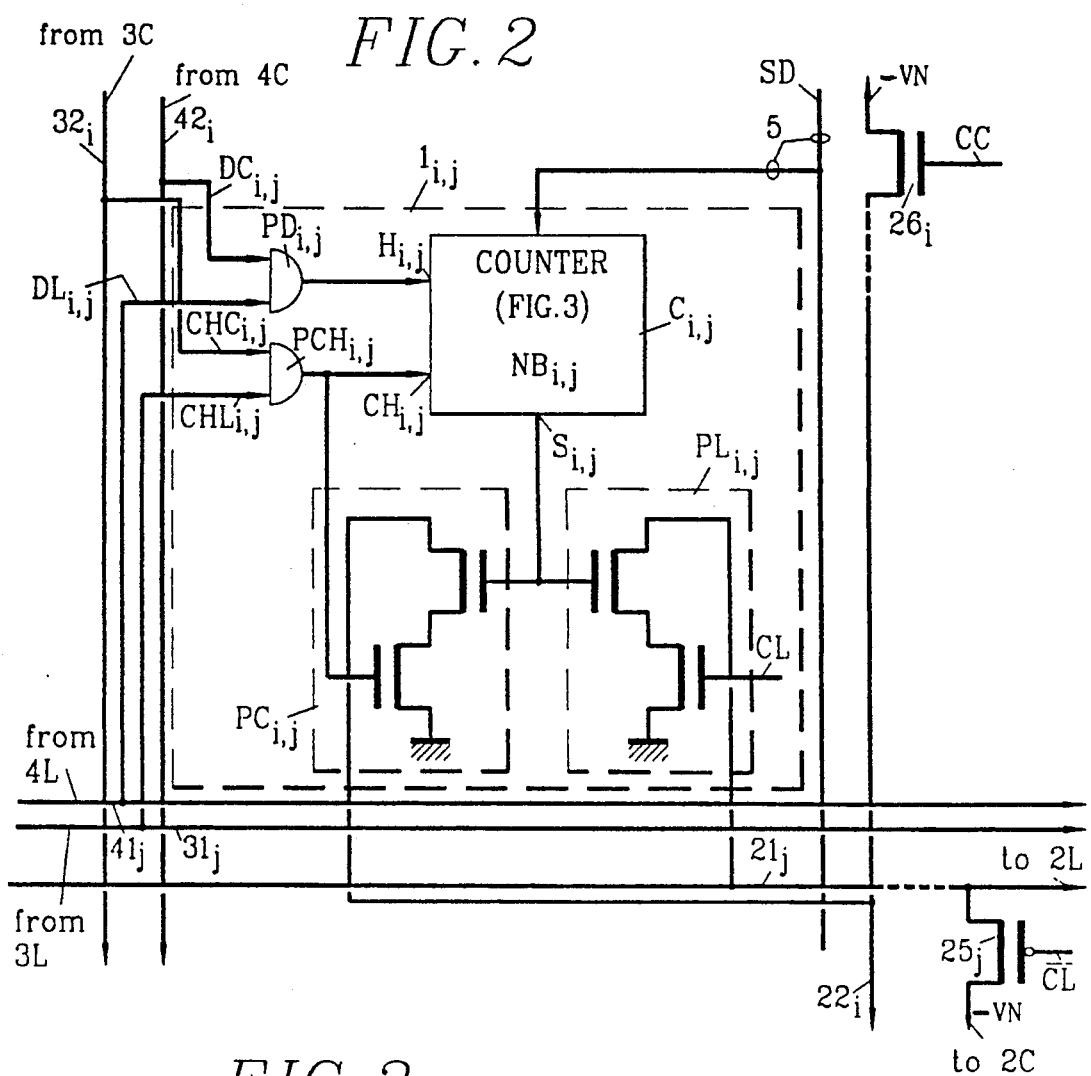
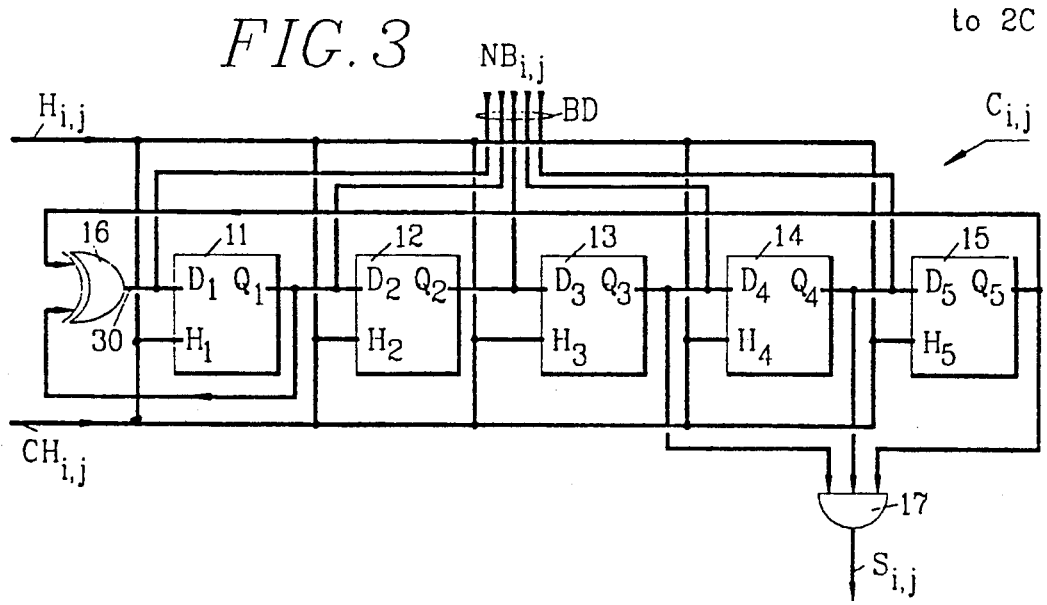

CIRCUIT MANAGING NUMBERS OF ACCESSES TO LOGIC RESOURCES

BACKGROUND OF THE INVENTION

1—Field of the Invention

This invention relates to a circuit for managing numbers of accesses to logic resources thereby deriving write addresses of available resources in a set of logic resources in dependence on the numbers of accesses updated, the number of accesses attributed to a logic resource being decremented by one unity in response to a read address of said resource.

For example, logic resources are data cells of a memory which is used in a time switching system and in which data received randomly are written.

2—Description of the Prior Art

The U.S. Pat. No. 4,884,264 divulges a system for switching data blocks between plural incoming time division multiplex ways and plural outgoing time division multiplex ways. The blocks in each of the multiplex ways can be synchronous blocks in circuit-mode and/or asynchronous blocks in packet-mode, and have a constant length.

In particular the asynchronous blocks in the same communication are transmitted sporadically in the multiplex ways.

All the data blocks are written progressively with their arrival into a buffer memory and are read-out one or several times from the buffer memory so as to be diffused to one or several outgoing multiplex ways. In effect, the communication relating to data blocks in an incoming way can be a point-to-point communication or a multipoint communication. For a multipoint communication a data block must be read in the buffer memory s many times as there are addressee outgoing multiplex ways which should receive the data block. The buffer memory cell in which a data block is written must be released on the last read of the block.

As embodied by this invention the logic resources can thus be data block cells of the buffer memory, and the number of accesses to a resource designates the number of read-outs or number of outgoing multiplex ways to which a data block stored in the resource must be diffused.

Aware that firstly, the data blocks are written sporadically in the buffer memory, secondly a data block must remain in the buffer memory during several read-out cycles in order to be diffused, U.S. Pat. No. 4,884,264 proposes an access number managing circuit, referred to as a "buffer memory" managing and write addressing circuit" so as to optimize the capacity of the buffer memory whilst managing it, i.e., updating the numbers of accesses progressively as data blocks are diffused.

This managing circuit is basically organized around two memories, each memory containing cells respectively associated to those of the buffer memory.

A first memory, referred to as a "cell release memory", stores the updated numbers access. Initially, when a data block is written-in, a cell in the first memory stores the number of accesses to which the block should be transmitted, then on each time this block is read-out, the number of accesses is decremented by unity until it reaches zero so as to release the associated cell in the buffer memory for writing another block.

In order to update each access number, the data outputs and inputs of the first memory are linked through a decrementation circuit and a zero test circuit, and the first memory is associated to other multiplexers and logic gates for its write-in and read-out addressing as a function of the write-in and read-out times of the buffer memory cells notably.

The second memory referred to as an "available cell address memory", forms a circuit for memorizing logic resource availability conditions, i.e., block cell conditions in the buffer memory, and for deriving free cell addresses. This circuit is described in the European patent application No. 298,793. The second memory basically comprises a matrix of one-bit cells, and a buffer memory cell address encoding circuit. The cells of the matrix are respectively assigned to the block cells of the buffer memory. Each matrix cell memorize an availability condition bit of the respective cell of the buffer memory. The condition bit is at high state "1" when the buffer memory cell is free and is thus ready to store a data block from an incoming multiplex way. The condition bit is at low state "0" when the buffer memory cell is occupied by a written data block which is to be read-out one or several times depending on the respective updated number of accesses memorized in the first memory. The encoding circuit in the second memory is connected to the outputs of all the cells of the matrix so as to select one of the cells of the matrix having a free condition bit "1", according to a predetermined cell priority order, and thus permanently derive the address of a free matrix cell selected equal to the write address of the respective block cell in the buffer memory.

Apart from the decrementation circuit and the zero test circuit, other logic means between the data output of the first memory and the data input of the second memory are provided in the managing circuit so as to modify the condition bits in the second memory. In fact, on reading a data block, only the corresponding cell in the first memory is read-out and write-in addressed to decrement the number of accesses by one unity as long as it is different from zero, the bit at the low state in the corresponding cell of the second memory not being modified. Conversely, when the number of accesses reaches zero, after the last data block read-out, the decrementation circuit requests modification of the condition bit in the second memory.

The material separation of the update of access numbers essentially made by the first memory and of the monitoring of the availability conditions of the logic resources made by the second memory is thus restrictive both from the point of view of the time to perform this operations which depend on the numerous circuits implemented, and the point of view of the cumbersomeness of the different circuits and memories.

OBJECTS OF THE INVENTION

The main object of this invention is to improve the operating speed and compactness of a circuit managing numbers of accesses to logic resources and at the same time reduce the cost of manufacturing such a circuit.

Another object of this invention is to combine, functionally and materially, the first and second memories in the known circuit into a single cell-matrix circuit.

SUMMARY OF THE INVENTION

Accordingly there is provided a circuit managing numbers of accesses to logic resources thereby deriving write-in addresses of available resources in a set of logic resources contingent on updated numbers of accesses, the access number attributed to a logic resource being decremented by one unity in response to a read-out address of the resource. The circuit comprises:

- a matrix including counting cells which respectively store the updated access numbers of the resources,
- cell selection means for selecting one of the counting cells containing access numbers equal to zero thereby deriving the write-in address of the available resource associated to the selected cell and loading the access number of the available resource into the cell selected, and
- resource read-out address decoding means for decrementing by one unity the access number different from zero in the counting cells in response to the resource read-out addresses respectively.

Thus the counting cell matrix acts both to monitor the availability of the logic resources and to update the numbers of accesses.

Concerning the monitoring of resources so as to select a free resource, the selection means comprises, preferably, first means for selecting amongst all rows of the matrix, matrix rows each having at least one counting cell storing an access number equal to zero thereby deriving the address of one of the selected rows, and second means for selecting amongst all columns of the matrix, matrix columns comprising counting cells which contain access numbers equal to zero and which are included in the selected row whose address is derived thereby deriving the address of one of the selected columns and loading an access number in the counting cell corresponding to the derived addresses of the selected line and selected column.

Concerning the update of resources, the read-out address decoding means comprises, preferably, first means for preparing the decrementation of the counting cells in a row of the matrix in response to a row address included in a read-out address, and means for decrementing by one unity the prepared counting cell in response to a column address included in the read-out address, the decrementation of the counting cell being simultaneous to the access number loading in another counting cell by the cell selection means.

According to a preferred embodiment, each counting cell comprises a pseudo-random sequence synchronous counter. The sequence consists of encoded words respectively associated to different decreasing numbers of accesses less than a maximum number. The counter comprises, on output side, means for signalling a zero access number contained in said cell to the cell selection means when a last word of the sequence is contained in the counter.

BRIEF DESCRIPTION OF THE DRAWINGS

Further features and advantages of the invention will be apparent from the following description of several preferred embodiments of the invention as illustrated in the corresponding accompanying drawings in which:

FIG. 2 shows in detail one of the counting cells included in the counting cell matrix; and FIG. 3 shows in detail a counter included in a counting cell.

DESCRIPTION OF THE PREFERRED EMBODIMENTS

Figure 1:
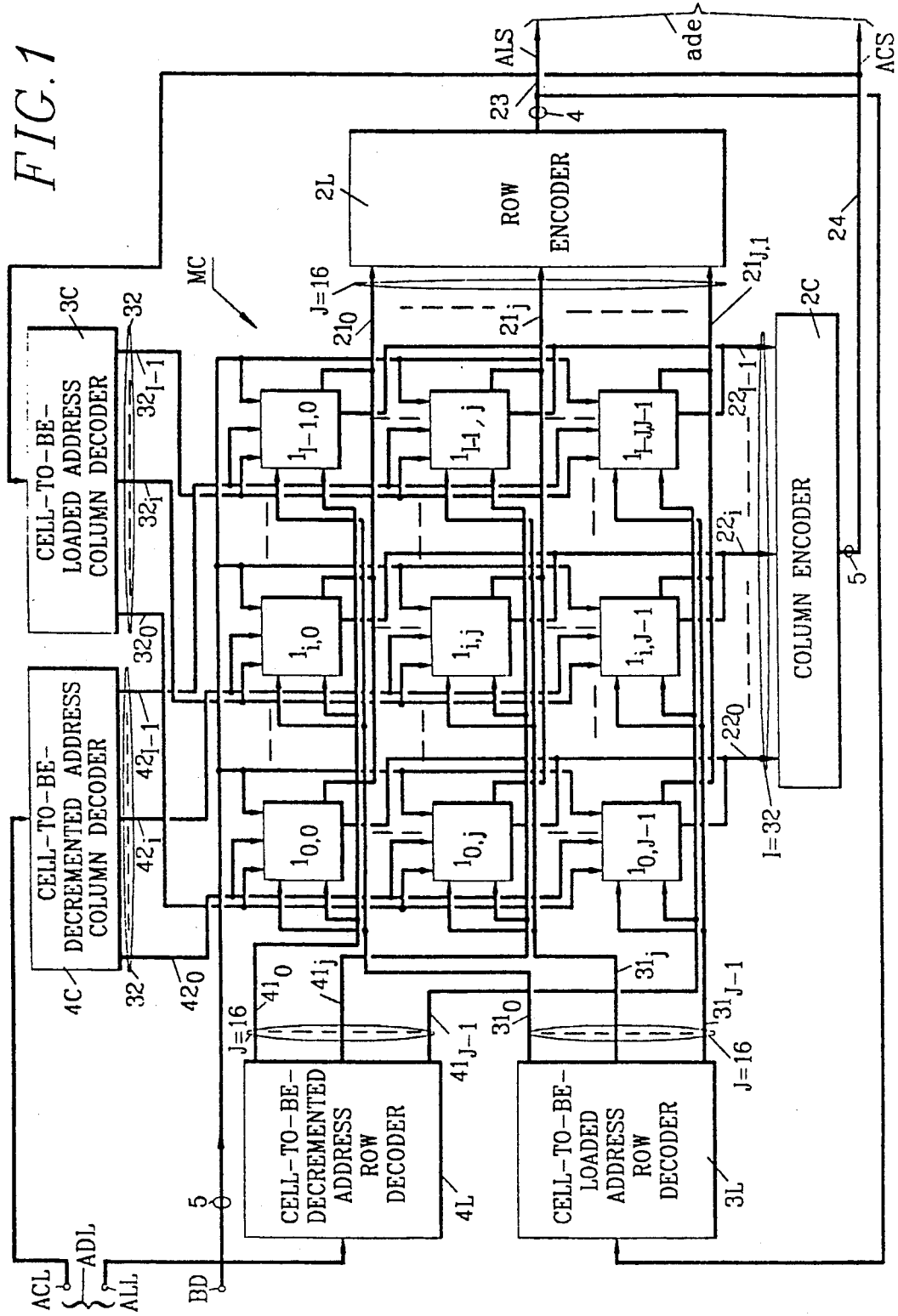
FIG. 1 is a block diagram of an access number managing circuit as embodied by the invention, comprising a counting cell matrix.

In the embodiment described below, it is assumed that a managing circuit as embodied by the invention is designed to control the accesses to the logic resources consisting, for example, in data cells of a buffer memory incorporated into an asynchronous and/or synchronous data time switching system of the type defined in the U.S. Pat. No. 4,884,264. The buffer memory consists of data cells which are organized in a matrix having $I=32$ columns and $J=16$ rows and which store 1024 octets transmitted by sixteen parallel incoming multiplex ways. Each incoming multiplex way transmits frames of approximately 32 data blocks preceded by a frame alignment word. Each data block contains sixteen octets which are transmitted later to one or several respective outgoing multiplex ways as access to logic resource relating to the data cell having stored the first octet, so-called label byte, of the data block. A data block can consist, either of data in packet-mode, i.e., an asynchronous packet, or of data in circuit-mode, i.e., for example a set of sixteen consecutive octets of a digitized speech way. Each cell of the data memory is capable of storing eight bits.

It should be noted that a managing circuit as embodied by the invention can also be used in a more general dynamic logic resource management context such as for example buffer memories in interfaces.

Referring to FIG. 1 the circuit managing numbers of accesses to logic resources, as embodied by the invention, is structured around a matrix MC comprising $I=32$ columns and $J=16$ rows of identical counting cells $1_{0,0}$ to $1_{I-1,J-1}=1_{31,15}$. Each counting cell $1_{i,j}$ where i is an integer index lying between 0 and $I-1=31$ and j is an integer index lying between 0 and $J-1=15$, stores the instantaneous access number $NB_{i,j}$ relating to a corresponding data cell of the buffer memory.

The access number $NB_{i,j}$ is equal to the number of outgoing multiplex ways to which the data block stored in buffer memory and whose label is stored in the corresponding data cell, should be still diffused. When the data block is received and written in buffer memory, the number $NB_{i,j}$ is maximum and equal to the number of outgoing multiplex ways for which the data block is intended. Then on each read-out of the data block the number $NB_{i,j}$ is decremented by one unity. Each read-out can take place at the most after transmitting 16 data blocks in the 16 outgoing ways respectively. When a data block has been read and transmitted to the $NB_{i,j}$ corresponding outgoing multiplex ways, the number $NB_{i,j}$ is equal to zero.

According to the embodiment illustrated, when the number $NB_{i,j}$ is different from zero, the output of the counting cell $1_{i,j}$ is at state "0" which indicates that the data cell is occupied by data and is therefore unavailable to write-in data. On the contrary thereto, when the number $NB_{i,j}$ is equal to zero, i.e., after the last read-out of the corresponding data block in buffer memory, the output of the counting cell $1_{i,j}$ is at state "1". This state "1" indicates the availability of the data cell to write-in data, such as a label, relating to another data block transmitted by one of the incoming multiplex ways.

Apart from the counting cells matrix MC, the managing circuit comprises a couple of encoders 2L and 2C, a first couple of decoders 3L and 3C, and a second couple of decoders 4L and 4C. In each of the three couples, one of the components, such as encoder 2L, decoder 3L and decoder 4L, relates to row addresses of matrix MC, and the other of the components, such as encoder 2C, decoder 3C and decoder 4C, relates to column addresses of matrix MC.

Encoders 2L and 2C offer respectively $J=16$ inputs $21_0$ to $21_{J-1}$ and $I=32$ inputs $22_0$ to $22_{I-1}$. An input $21_j$ of encoder 2L is linked to row read-out outputs from cells $1_{O,j}$ to $1_{I-1,j}$ in the rank-j row of matrix MC. Likewise an input $22_i$ of encoder 2C is linked to column read-out outputs of cells $1_{i,O}$ to $1_{i,J-1}$ in the rank-i column of matrix MC.

As will be seen subsequently, the search of a counting cell in matrix MC is performed firstly row by row in response to a row read-out control signal CL, then column by column in response to a column read-out control signal CC. When at least one of the cells in the rank-j row, respectively in the rank-i column, is available, the row, respectively column, read-out output of the cell is at state "1" which requires state "1" on input $21_j$ of encoder 2L, respectively $22_i$ of encoder 2C. Conversely, when all the cells in a row or column contain access numbers different from zero, i.e., have their output at state "0", the corresponding input of encoder 2L or 2C is at state "0". Thus the links between outputs of the cells in the same row or column of the matrix are equivalent to wired ORs.

The selection of a row or column comprising a free counting cell in encoder 2L or 2C is performed according to a predetermined order of priority. Subsequently reference will be made, as example, to the following order of priority. Aware that the rows and columns are numbered by increasing order 0 to $J-1$ and 0 to $I-1$, encoder 2L selects the row comprising an available cell and having the lowest rank, and encoder 2C selects the columns comprising an available cell and having the lowest rank. Thus encoder 2L produces the rank of the selected row in the shape of an address ALS with $\log_2 J=4$ parallel bits in an output bus 23, and encoder 2C produces the rank of the selected column in the shape of an address ACS with $\log_2 I=5$ parallel bits in an output bus 24. The two addresses ALS and ACS form an address of a selected available counting cell, which is equal to the write-in address ade of the corresponding data cell in buffer memory.

Decoders 3L and 3C are designed to load the number of accesses in a selected available counting cell, when a data block arrives.

Decoders 3L and 3C respectively offer $J=16$ outputs $31_0$ to $31_{J-1}$ and $I=32$ outputs $32_0$ to $32_{I-1}$. An output $31_j$ of decoder 3L is linked to the first loading inputs $CHL_{O,j}$ to $CHL_{I-1,j}$ in cells $1_{O,j}$ to $1_{I-1,j}$ in the rank-j row of matrix MC. Likewise an output $32_i$ of decoder 3C is linked to second loading inputs $CHC_{i,O}$ to $CHC_{i,J-1}$ of cells $1_{i,O}$ to $1_{i,J-1}$ in the rank-i column of matrix MC. Decoders 3L and 3C also have parallel inputs linked respectively to buses 23 and 24 so as to decode the row and column addresses of an available counting cell so as to activate the loading inputs of this cell by states "1".

The second decoders 4L and 4C are designed to decrement by one unity the number of accesses in a counting cell whenever the corresponding data block stored in the buffer memory is to be transmitted to an access or outgoing multiplex way. This decrementation is thus authorized whenever the label of this data block has to be read in the corresponding data cell, in response to a read-out address ADL of the data cell set up by the read addressing and control circuit included in the switching system. The read-out address ADL is in fact composed of a 4-bit row address ALL applied to decoder 4L and a 5-bit column address ACL applied to decoder 4C.

Like decoders 3L and 3C, decoders 4L and 4C offer $J=16$ outputs $41_0$ to $41_{J-1}$ and $I=32$ outputs $42_0$ to $42_{I-1}$. An output $41_j$ of decoder 4L is linked to the first decrementation inputs $DL_{O,j}$ to $DL_{I-1}$ of cells $1_{O,j}$ to $1_{I-1,j}$ in the rank-j row of maxtrix MC. Output $41_j$ is at state "1" when address ALL is equal to j in binary code. Likewise an output $42_i$ of decoder 4C is linked to second decrementation inputs $DC_{i,O}$ to $DC_{i,J-1}$ of cells $1_{i,O}$ to $1_{i,J-1}$ in rank-i column of matrix MC. Output $42_i$ is to state "1" when address ACL is equal to i in binary code.

Referring to FIG. 2, a counting cell $1_{i,j}$ comprises a counter $C_{i,j}$, two two-inputs NAND gates $PL_{i,j}$ and $PC_{i,j}$ and two two-inputs AND gates $PCH_{i,j}$ and $PD_{i,j}$.

Gates $PL_{i,j}$ and $PC_{i,j}$ have first inputs linked to an output $S_{i,j}$ of counter $C_{i,j}$. Output $S_{i,j}$ is at state "0" when the number of accesses $NB_{i,j}$ corresponding to the count updated in the counter is different from zero, i.e., when cell $I_{i,j}$ is unavailable. In practice, as illustrated in FIG. 2, the NAND gates $PL_{i,j}$ and $PC_{i,j}$ are each made by means of first and second MOS transistors and a respective load MOS transistors $25_j$, $26_i$. In each of the gates $PL_{i,j}$ and $PC_{i,j}$, the drain of the first MOS transistor is linked to the source of the second MOS transistor and the source of the first transistor is grounded. All the transistors of each of the gates $PL_{i,j}$ and $PC_{i,j}$ are P way type.

The first gate $PL_{i,j}$ is designed to transfer state "1" of output $S_{i,j}$ from counter $C_{i,j}$ which corresponds to the free state of the cell towards the input of row $21_j$ of encoder 2L in response to the first read-out control signal CL at high state "1". The gate of the first transistor receives the signal CL whereas the gate of the second transistor is linked to the output of counter $S_{i,j}$ in gate $PL_{i,j}$. The load transistor $25_j$ is common to all the cells $1_{O,j}$ to $1_{I-1,j}$ of the rank-j row in matrix MC and is located on input to encoder 2L. The gate of transistor $25_j$ receives the first inversed control signal $\overline{CL}$, the source of this transistor is linked to input $21_j$ and the drain of this transistor is set to a negative bias voltage $-VN$. Thus when $CL=$"1" and $S_{i,j}=$"1", the state of output $S_{i,j}$ of counter $C_{i,j}$ is transferred to input $21_j$ of encoder 2L, whatever the states of the other counters $C_{O,j}$ to $C_{I-1,j}$ in the rank-j row. Input $21_j$ becomes state "0" only when all the outputs of counters $C_{O,j}$ to $C_{I-1,j}$ are at state "0", i.e., when all the counting cells $1_{O,j}$ to $1_{I-1,j}$ contain access numbers $NB_{O,j}$ to $NB_{I-1,j}$ different from zero.

The second gate $PC_{i,j}$ is designed to transfer state "1" on output $S_{i,j}$ from counter $C_{i,j}$ towards the column input of encoder 2C in response to the second control signal CC, when output $31_j$ of decoder 3L is at state "1" after selecting the rank-j row by encoder 2L. In gate $PC_{i,j}$, the gates of the first and second transistors are linked respectively to output $S_{i,j}$ of counter $C_{i,j}$ and output $31_j$ of decoder 3L. The load transistor $26_i$ is common to all the cells $1_{i,O}$ to $1_{i,J-1}$ of the rank-i row in matrix MC and is located on the input of encoder 2C. Relatively to this transistor $26_i$, in a similar way to transistor $25_j$, the gate receives the second control signal CC, the source is linked to input $21_i$ and the drain is set to negative voltage $-VN$. The operation of gate $PC_{i,j}$ is similar to that of gate $PL_{i,j}$. Particularly when outputs $S_{i,j}$ and $31_j$ are at state "1", the state of input $22_i$ of encoder 2C is at availability state "1" whatever the states of the inputs of the other counters $C_{i,0}$ to $C_{i,J-1}$ in the rank-i row.

The inputs of gate $PCH_{i,j}$ are linked respectively to output $31_j$ of decoder 3L and to output $32_i$ of decoder 3C. When the inputs of gates $PCH_{i,j}$ are set to state "1", the output of gate $PCH_{i,j}$ controls, via a loading input $CH_{i,j}$ of counter $C_{i,j}$, the loading of a number $NB_{i,j}$ in this counter. The number $NB_{i,j}$ is transmitted by a data bus BD (FIG. 3), typically with five wires, which is linked to five data inputs of counter $C_{i,j}$.

The inputs of gate $PD_{i,j}$ are linked respectively to output $41_j$ of decoder 4L and output $42_i$ of decoder 4C. When the inputs of gate $PD_{i,j}$ switch to state "1", a clock input $H_{i,j}$ of counter $C_{i,j}$ linked to the output of gate $PD_{i,j}$ controls decrementation by one unity of the number $NB_{i,j}$.

The operation of the access number managing circuit is now described during a cycle which corresponds to an octet clock period in the incoming and outgoing multiplex ways. This octet period during which a data block can be written in the buffer memory as a function of an address ade and another data block can be read-out to the buffer memory as a function of an address ADL, is typically of a few dozen nanoseconds.

A given cycle comprises the loading of counter $C_{i,j}$ of a first cell $1_{i,j}$ by a 5-bit word representing access number $NB_{i,j}$ equal to the number of read-outs to be made in the data cell corresponding to the write-in address ade=[ACS, ALS] selected during the cycle preceding the given cycle. The given cycle comprises, simultaneous to loading, a decrementation by one unity of the updated number $NB_{p,q}$ of counter $C_{p,q}$ of a second cell $1_{p,q}$ in matrix MC, in response to the read-out address ADL=[ALL, ACL] supplied at the start of the given cycle and authorizing a read-out of the data block corresponding to address ADL in the buffer memory. Indices p and q vary between 0 and I-1 and between 0 and J−1 with p ≠i and q ≠j; a data block cannot be simultaneously written-in and read-out in buffer memory, given that the outgoing multiplex ways are scanned cyclically by the time base (not shown) of the switching system, in this case all the 16 octet periods. Lastly, after the above loading and decrementation corresponding to an update of the counters of matrix MC, the given cycle comprises the search for an available counting cell so as to derive another write-in address ade in correspondance with which an incoming data block will be written in buffer memory during the cycle following the given cycle.

At the start of the given cycle, simultaneous to receiving the number $NB_{i,j}$ in data bus BD, the first decoders 3L and 3C apply states "1" to outputs $31_j$ and $32_i$, enabled by a loading signal supplied by the time base at the end of the cycle preceding the given cycle as will be seen subsequently. Only gate $PCH_{i,j}$ in available cell $1_{i,j}$ in matrix MC has its inputs $CHC_{i,j}$ and $CHC_{i,j}$ at state "1". Subsequently inputs $CH_{i,j}$ of counter $C_{i,j}$ becomes state "1" to load this counter with the number $NB_{i,j}$. Output $S_{i,j}$ of counter $C_{i,j}$ switches from state "0" to busy state "1".

Also at the start of the given cycle, in response to decrementation signals supplied by the time base, the second decoders 4L and 4C simultaneously receive the read-out addresses ACL and ALL and decode them. The decoder outputs $41_q$ and $42_p$ are to state "1". Only gate $PD_{p,q}$ of cell $1_{p,q}$ in matrix MC has its inputs $DL_{p,q}$ and $DC_{p,q}$ at state "1". Subsequently the clock input $H_{p,q}$ of counter $C_{p,q}$ is at state "1" to decrement by one unity the updated number $NB_{p,q}$ in counter $C_{p,q}$. In practice, as will be seen later, this decrementation consists in modifying an encoded word representative of the number $NB_{p,q}$. Output $S_{p,q}$ of counter $C_{p,q}$ remains to busy condition "0" when the number $NB_{p,q}$ is still greater than or equal to one, i.e., when the data block corresponding to the address [ACL,ALL]=ADL in buffer memory has still to be diffused to outgoing multiplex ways, or output $S_{p,q}$ switches to free condition "1" when the corresponding data block has not to be read out in buffer memory.

At this stage it appears that all the counting cells in matrix MC, including those $1_{i,j}$ and $1_{p,q}$ having been the subject of a recent loading and a recent decrementation, are updated. The search of an available cell can then begin.

The search for an available cell is initiated by the first control signal CL at high state "1" which is applied to the second inputs of the NAND gates $PL_{0,0}$ to $PL_{I-1,J-1}$. Simultaneously the inversed signal $\overline{CL}$ is to state "0" and makes the load transistors $25_0$ to $25_{J-1}$ active. Through the wired-OR links of the outputs of gates $PL_{0,0}$ to $PL_{I-1,J-1}$, inputs $21_0$ to $21_{J-1}$ of row address encoder 2L reproduce the free condition "1" of at least one of the cells in each of the rows respectively. Encoder 2L selects by priority one of the inputs $21_0$ to $21_{J-1}$ to free condition "1" having the smallest row address which forms the selected row write-in address ALS in output bus 23.

Subsequent to switching of signal CL to state "0" unloading inputs $21_0$ to $21_{J-1}$ and closing the first gates $PL_{0,0}$ to $PL_{I-1,J-1}$, the row address decoder 31 and transistors $26_0$ to $26_{I-1}$ are activated by the second control signal CC. Decoder 3L decodes the selected address ALS in bus 23 by applying state "1" to output $31_{ALS}$ corresponding to address ALS. The load transistors $26_0$ to $26_{I-1}$ activate all the second NAND gates $PC_{0,0}$ to $PC_{I-1,J-1}$, but only the second gates in the row with the address ALS are opened by output $31_{ALS}$. The result is that, amongst inputs $22_0$ to $22_{I-1}$ of column address encoder 2C, the ones at state "1" correspond to available cells in the row with the address ALS, and the ones at state "0" correspond to unavailable cells in the row with the address ALS. In fact the outputs of decoder 3L other than $31_{ALS}$ are at state "0" and keep the second corresponding NAND gates closed.

Encoder 2C then selects by priority one of the inputs $22_0$ to $22_{I-1}$ at free condition "1" having the smallest column address which forms the selected column write-in address ACS in output bus 24.

The couple of selected address [ALS, ACS] forming a write-in address ade is thus transmitted to write-in registers of the buffer memory so as to write in it a data block from an incoming multiplex way, and to queues and a control memory included in a read addressing and control circuit of the switching system so as to subsequently read out the data block recently written-in several times contingent on the number of accesses $NB_{ALS,ACS}$ loaded in the cell selected $1_{ALS,ACS}$ at the start of the next cycle.

As already stated, at the start of the next cycle, in response to the loading signal, the address ACS applied by encoder 2C via bus 24 is decoded by decoder 3C so that output $42_{ACS}$ switches to state "1". In matrix MC, only the AND gate $PD_{ALS,ACS}$ has its inputs at state "1", which authorizes loading of counter $C_{ALS,ACS}$ with the number $NB_{ALS, ACS}$.

Referring to FIG. 3, a counter $C_{i,j}$ included in a counting cell $1_{i,j}$ chiefly contains five cascade-connected flip-flops "D" 11, 12, 13, 14, 15, an EXCLUSIVE-OR gate 16 and an AND gate 17.

The counter shown is a synchronous counter. The same clock signal which can be at one time a loading signal delivered by gate $PCH_{i,j}$, at another time a decrementation signal delivered by gate $PD_{i,j}$ is applied simultaneously to clock inputs $H_1$ to $H_5$ of flip-flops 11 to 15 linked to the terminals of counter $CH_{i,j}$ and $H_{i,j}$. Flip-flops 11 to 15 have inputs $D_1$ to $D_5$ linked to the wires of data bus BD.

Counter $C_{i,j}$ is also pseudo-random sequence-type. For this purpose the outputs of two flip-flops are looped back on the input of the first flip-flop 11.

According to the embodiment illustrated, output $Q_5$ of the last flip-flop 15 and output $Q_1$ of the first flip-flop 11 are linked respectively to the inputs of EXCLUSIVE-OR gate 20 whose output 30 is linked to output $D_1$ of the flip-flop 11. The AND gate 17 possesses, according to the embodiment illustrated, three inputs linked respectively to outputs $Q_3$, $Q_4$ and $Q_5$ of flip-flops 13, 14 and 15. The output of gate 17 forms output $S_{i,j}$ of the counter which is to state "1" if the three outputs $Q_3$, $Q_4$ and $Q_5$ are to state "1" and to state "0" if at least one of the three outputs $Q_3$, $Q_4$ and $Q_5$ is to state "0".

The choice of a synchronous pseudo-random sequence-type counter for each cell of the counting matrix MC as embodied by the invention is notably linked to the operating speed requirements.

In fact, in an asynchronous counter, the clock input of a flip-flop is linked to the output of the preceding flip-flop and thus a delay is generated between two clock inputs of the two successive flip-flops, the delay corresponding to the switchover time of the preceding flip-flop. Counting or down-counting is therefore faster in synchronous counters.

To load counter $C_{i,j}$, state "1" is applied to input $CH_{i,j}$ and simultaneously the bits of the encoded word $NB_{i,j}$ in bus BD are applied to inputs $D_1$ to $D_5$ of the flip-flops so that outputs $Q_1$ to $Q_5$ store the states of the five bits of the word $NB_{i,j}$.

The loaded 5-bit word is representative of the number of read-outs $NB_{i,j}$ to be made and does not originate from binary encoding of the number $NB_{i,j}$ as will be seen later.

So as to decrement to the number $NB_{i,j}$ and consequently modify the corresponding 5-bit encoded word according to a pseudo-random sequence, a clock pulse "1" is applied to input $H_{i,j}$ of counter $C_{i,j}$ and subsequently to all the clock inputs $H_1$ to $H_5$ of flip-flops 11 to 15. Responsive to the clock pulse, the four flip-flops 12, 13, 14 and 15 generate the states of outputs $Q_1$, $Q_2$, $Q_3$, $Q_4$ preceding the pulse, respectively. The first flip-flop generates on output $Q_1$ the state on the output of the EXCLUSIVE-OR gate 16 depending on the states on outputs $Q_5$ and $Q_1$ of flip-flops 15 and 11 preceding the pulse.

Successive decrementations in the counting cell $1_{i,j}$ produce successive words of a part or the whole of a pseudo-random sequence on outputs $Q_1$, $Q_2$, $Q_3$, $Q_4$ and $Q_5$ in counter $C_{i,j}$. For example, assuming that the numbers of accesses $NB_{i,j}$ cannot be greater than a maximum number equal to 18, the decrementations of this maximum number produce the following sequence of encoded words $[Q_1, Q_2, Q_3, Q_4$ and $Q_5]$:

| $NB_{i,j}$ = read-out or access number | $Q_1$ | $Q_2$ | $Q_3$ | $Q_4$ | $Q_5$ |
|---|---|---|---|---|---|
| 18 | 0 | 1 | 0 | 1 | 1 |
| 17 | 1 | 0 | 1 | 0 | 1 |
| 16 | 0 | 1 | 0 | 1 | 0 |
| 15 | 0 | 0 | 1 | 0 | 1 |
| 14 | 1 | 0 | 0 | 1 | 0 |
| 13 | 1 | 1 | 0 | 0 | 1 |
| 12 | 0 | 1 | 1 | 0 | 0 |
| 11 | 0 | 0 | 1 | 1 | 0 |
| 10 | 0 | 0 | 0 | 1 | 1 |
| 9 | 1 | 0 | 0 | 0 | 1 |
| 8 | 0 | 1 | 0 | 0 | 0 |
| 7 | 0 | 0 | 1 | 0 | 0 |
| 6 | 0 | 0 | 0 | 1 | 0 |
| 5 | 0 | 0 | 0 | 0 | 1 |
| 4 | 1 | 0 | 0 | 0 | 0 |
| 3 | 1 | 1 | 0 | 0 | 0 |
| 2 | 1 | 1 | 1 | 0 | 0 |
| 1 | 1 | 1 | 1 | 1 | 0 |
| 0 | 1 | 1 | 1 | 1 | 1 |

According to other examples, if the number $NB_{i,j}$ is equal to 13 or 6, a sequence only begins the loading of the encoded word "1101" or "00010".

Loop-back consisting in linking outputs $Q_5$ and $Q_1$ of the last flip-flop 15 and the first flip-flop 11 to input $D_1$ of the first flip-flop 11 through the EXCLUSIVE-OR gate 16 enables a longer sequence to be generated than a sequence generated without loop-back. In effect, without loop-back, the counter is similar to a shift register and the maximum number of states on outputs $Q_1$ to $Q_5$ is limited to five which corresponds to a number of accesses in practice insufficient within the context of packet time switching.

Likewise a single loop-back, formed for example by the linkage from output $Q_5$ to input $D_1$, only allows for a repetitive cyclic sequence only containing five different successive states.

Counter $C_{i,j}$ as embodied by the invention does not down-count in "pure" binary code and is thus chosen on grounds of cost and compactness. In fact, the construction of a "pure" binary counter requires the addition of supplementary logic gates which increases the size of the integrated circuit. The reduction in the cost of the counting cells matrix, as embodied by the invention, is all the greater when the number of counters $C_{0,0}$ to $C_{I-1,J-1}$, typically equal to 512, is high.

In a time switching system including the managing circuit, the data cell read-out number is only limited to eighteen according to the example above, thus providing for a multipoint diffusion of a data block limited to eighteen outgoing multiplex ways.

AND output gate 17 forms a means for signalling the free or busy condition of the data cell corresponding to counting cell $1_{i,j}$ according to whether update number $NB_{i,j}$ is equal to or different from zero. Output $S_{i,j}$ of gate 17 is at state "1" to indicate the data cell corresponding to the counting cell $1_{i,j}$ is free and therefore can be write-in addressed. The states of the last three flip-flop outputs $Q_3$, $Q_4$ and $Q_5$ are then at state "1".

Referring to encoded words $[Q_1, Q_2, Q_3, Q_4$ and $Q_5]$ of the sequence previously described, only the binary word "11111" implies state "1" on output $S_{i,j}$ and indicates the unavailability of the cell.

In the case in which the number $NB_{i,j}$ is not supplied directly in the form of one of the encoded words $[Q_1, Q_2, Q_3, Q_4$ and $Q_5]$ to matrix MC, bus BD is preceded by a suitable encoding means. For example, when the number $NB_{i,j}$ is in the form of a binary word denoted nbms for synchronous packet or nbma for asynchronous packet in U.S. Pat. No. 4,884,264, the encoding means encodes a word nbms, nbma issued from the binary encoding of $NB_{i,j}$, or a word nbms, nbma issued from the binary single bit at state "1" having a location as a function of $NB_{i,j}$, in the corresponding encoded word.

Thus within the context of a switching system according to the U.S. Pat. No. 4,884,264, an access number managing circuit as embodied by the invention fulfills the functions chiefly performed by the components marked MLC, DEC, TZ and MAD, included in the buffer memory managing and write addressing circuit CAE shown in FIG. 6 of the U.S. Pat. No. 4,884,264.

Moreover, the "row" and "column" words in this description and in the subject of this patent application defined hereafter, can be replaced by "column" and "row" respectively, without modifying the principle of operation of the access number managing circuit.

What we claim is:

1. A circuit for managing access numbers ($NB_{i,j}$) associated with a plurality of logic resources, respectively, thereby to derive among said logic resources write-in addresses (ade) contingent on said access numbers that are updated into updated access numbers (NBp,q), comprising:
   (a) matrix means (MC) including a plurality of counting cells ($1_{0,0} - 1_{1-J,J-1}$) for storing said updated access numbers, respectively, said cells being arranged in rows and columns;
   (b) logic resource read-out address decoding means (3C,3L) for updating said access numbers into said updated access numbers by decrementing by one unity those of said access numbers which are different from zero in said counting cells in response to logic resource read-out addresses (ADL), respectively; and
   (c) cell selecting means for selecting one of said counting cells having an updated access number equal to zero, deriving a write-in address of the available resource associated with said selected counting cell, and loading the access number associated with said available resource into said selected counting cell.

2. The circuit as defined in claim 1, wherein said cell selecting means includes first means for selecting a matrix row having at least one counting cell storing an access number equal to zero and for deriving the address of said selected row, and second means for selecting a column of said counting cells.

3. The circuit according to claim 1, wherein said cell selecting means includes first means for selecting from the rows of said matrix a row containing a counting cell having stored therein an updated access number equal to zero, and for deriving a row address for said selected row, and second means for selecting from said matrix columns a column including a counting cell containing a stored updated access number equal to zero and which is included in said selected row, and for deriving a column address for said selected column address for said selected column, and means for loading said access number in said counting cell corresponding with said row and column address.

4. The circuit according to claim 3, wherein said derived row address and said derived column address are among the lower row addresses of the matrix rows having at least one counting call storing an updated access number equal to zero, and among the lower column addresses of the matrix columns including counting cells storing updated access numbers equal to zero, respectively.

5. The circuit according to claim 3, wherein each counting cell comprises means for signalling an access number equal to zero stored in each counting cell to an input of said first encoding means which is common to the counting cells included in the matrix row corresponding to each of said counting cells in response to a first control signal, and means for signalling said zero access number to an input of said second write-in address encoding means which is common to the counting cells in the matrix column corresponding to each of said counting cells in response to said loading preparation of the cells in said matrix row corresponding to each of said counting cells by said first write-in address decoding means and in response to a second control signal.

6. The circuit according to claim 1, wherein said logic resource read-out address decoding means comprises means for preparing decrementation of counting cells included in a row of said matrix in response to a row address included in one of the read-out addresses into prepared row counting cells, and means for decrementing by one unit one of said prepared row counting cells in response to a column address included in said one of the read-out addresses, a decrementation of said one prepared row of counting cells by said decrementing means being simultaneous with the loading of an access number in another counting cell by said cell selecting means.

7. The circuit according to claim 1, wherein each counting cell comprises a synchronous counter having a pseudo-random sequence.

8. The circuit according to claim 7, wherein said pseudo-random sequence is composed of encoded words respectively associated to different decreasing access numbers less than a maximum number, said counter including an output side, said means for signalling a zero access number stored in each counting cell to said cell selecting means when the last of said encoded words of said pseudo-random sequence is contained in said counter.

9. A circuit for managing access numbers associated with a plurality of logic resources, respectively, and for deriving write-in addresses of available logic resources in response to access numbers that are updated to define updated access numbers, respectively, comprising:
   (a) maxtrix means including rows and columns of counting cells which store said updated access numbers of said logic resources, respectively;
   (b) first means for selecting one of said matrix rows including at least one counting cell storing an updated access number equal to zero, thereby deriving a row address of a selected row;
   (c) second means for selecting one of said matrix columns including counting cells which store updated access numbers equal to zero and which are included in said selected row whose address is derived, thereby deriving a column address of a selected column, and for loading one of said access numbers in one of said counting cells corresponding with said row address of said selected row and said column address of said selected column;
   (d) means for preparing decrementation of the counting cells in a row of said matrix into prepared row counting cells in response to a row address included in a logic response read-out address; and (e) means for decrementing by one unity one of said prepared row counting cells in response to a column address included on said logic resource read-out address, a decrementation of said one of the prepared counting cells by said decrementing means being simultaneous to an access number loaded in another counting cell in said matrix by said second selecting means.

10. The circuit according to claim 9, wherein each counting cell comprises a synchronous counter having a pseudo-random sequence.

11. The circuit according to claim 10, wherein said sequence is composed of encoded words respectively associated to different decreasing access numbers less than a maximum number, and said counter comprises, on output side, means for signalling a zero access number stored in each said counting cell to said first and second selecting means when a last of said encoded words of said pseudo-random sequence is contained in said counter.

* * * * *